United States Patent
Nagashima

(10) Patent No.: US 7,167,133 B2
(45) Date of Patent: Jan. 23, 2007

(54) ELECTROMAGNETIC WAVE MEASURING APPARATUS

(75) Inventor: Masami Nagashima, Tokyo (JP)

(73) Assignee: Advantest Corporation, Tokyo (JP)

( * ) Notice: Subject to any disclaimer, the term of this patent is extended or adjusted under 35 U.S.C. 154(b) by 45 days.

(21) Appl. No.: 10/760,949

(22) Filed: Jan. 20, 2004

(65) Prior Publication Data
US 2004/0155824 A1 Aug. 12, 2004

Related U.S. Application Data

(63) Continuation of application No. PCT/JP01/10365, filed on Nov. 28, 2001.

(30) Foreign Application Priority Data

Jul. 27, 2001 (JP) .............................. 2001-228624
Aug. 29, 2001 (JP) .............................. 2001-259805

(51) Int. Cl.
G01R 29/10 (2006.01)
(52) U.S. Cl. ....................... 343/703; 324/637
(58) Field of Classification Search ............... 343/703, 343/882, 881, 850, 752, 785, 786; 324/72, 324/637; 333/261, 263
See application file for complete search history.

(56) References Cited

U.S. PATENT DOCUMENTS

| | | | |
|---|---|---|---|
| 3,964,070 A * | 6/1976 | Drabowitch | 343/786 |
| 4,588,993 A * | 5/1986 | Babij et al. | 342/351 |
| 4,965,606 A * | 10/1990 | Merkel | 343/703 |
| 5,119,105 A * | 6/1992 | Ngai et al. | 343/703 |
| 5,983,124 A * | 11/1999 | Carr | 600/407 |
| 6,114,860 A * | 9/2000 | Yun | 324/637 |
| 6,249,248 B1 | 6/2001 | Kitayoshi | 342/360 |
| 6,914,571 B1 * | 7/2005 | Lemanczyk et al. | 343/703 |

FOREIGN PATENT DOCUMENTS

| JP | 11 - 295402 | 10/1999 |
|---|---|---|
| JP | 2001 - 133495 | 5/2001 |

OTHER PUBLICATIONS

International Search Report, Publication No. WO 03/012465, dated Feb. 13, 2003 (3 pgs.).
International Preliminary Examination Report dated May 19, 2003 (2 pgs.).
J. Adams; "Electric-Field Strengths Measured Near Personal Transceivers"; Proceedings of the International Symposium on Electromagnetic Compatability, Dallas, Aug. 9, 1993; pp. 42-45.
Patent Abstracts of Japan, Publication No. 2001-133495 dated May 18, 2001 (2 pgs.).

(Continued)

*Primary Examiner*—Tuyet Vo
*Assistant Examiner*—Jimmy Vu
(74) *Attorney, Agent, or Firm*—Osha Liang LLP

(57) ABSTRACT

According to the present invention, a small-sized electromagnetic wave measuring apparatus is provided which can simply measure an electromagnetic wave radiated from an antenna to be measured. The electromagnetic wave includes: a holder for holding the antenna to be measured; a plurality of probe antennas, provided on a circle having a center substantially at the holder, for detecting the electromagnetic wave radiated from the antenna to be measured; and a rotating unit for rotating the holder around a direction substantially perpendicular to a normal of the circle as a rotation axis.

16 Claims, 6 Drawing Sheets

OTHER PUBLICATIONS

Patent Abstracts of Japan; Publication No. 11-295402 dated Oct. 29, 1999 (2 pgs.).

B. Cown, et al.; Applications of A-MST Probe Arrays To Fast Diagnostic Testing Of Anechoic Chambers and Microwave Antennas; AMTA '97, 19th Meeting and Symposium, pp. 392-397 (1997).

C. Lhiaubet, et al.; "On-Line Control In Wood and Paper Industries by Means of Rapid Microwave Linear Sensors"; Conference Proceedings, 22nd European Microwave Conference 92, vol. 2, pp. 1037-1040 (1992).

B. Cown, et al.; "Advanced MST Probe Arrays for Rapid Diagnostic Imaging"; Proc. 20th Annu. Meet. Symp. Antenna. Meas. Tech. Assoc. 1998; pp. 241-246 (1998).

Ph. Garreau, et al.; "Optimization of the Arrangement Compact Range-Modulated Scattering Probe Array for Rapid Far-Field Antenna Measurement"; IEE Conf. Publ. (Indust. Electr. Eng.) No. 370, Pt. 1 1993; pp. 376-379 (1993).

J. Bolomey, et al.; "Rapid Near-Field Antenna Testing Via Arrays of Modulated Scattering Probes"; IEEE Trans. Antennas Propag vol. 36, No. 6 1988; pp. 804-814 (1988).

B. J. Cown, et al.; "Accuracy and Speed Characteristics of the Bistatic MST for Rapid Near-Field Antenna Measurements"; AP-S Int. Symp. (IEEE Antennas Propag Soc.) vol. 1987, No. vol. 1; pp. 174-177 (1987).

* cited by examiner

ELECTROMAGNETIC WAVE MEASURING APPARATUS

The present application is a continuation application of PCT/JP01/10365 filed on Nov. 28, 2001 which claims priority from Japanese Patent Applications 2001-228624 filed on Jul. 27, 2001 and 2001-259805 filed on Aug. 29, 2001, the contents of which are enclosed herein by reference.

BACKGROUND OF THE INVENTION

1. Field of the Invention

The present invention relates to an electromagnetic wave measuring apparatus. More particularly, the present invention relates to an electromagnetic wave measuring apparatus which measures an electromagnetic wave radiated from an antenna to be measured by detecting it by means of a plurality of probe antennas.

2. Related Art

A conventional electromagnetic wave measuring apparatus measures an electromagnetic wave radiated from an antenna to be measured on a partial sphere by scanning a large measuring antenna such as a dipole antenna, on a circular arc the center of which is positioned at the antenna to be measured or rotating the antenna to be measured at the center of the aforementioned circular arc.

A high-speed diagnostic testing of a microwave antenna by means of a probe array in accordance with an advanced modulated scattering technique (A-MST) is disclosed in "Applications of A-MST probe arrays to fast diagnostic testing of anechoic chambers and microwave antennas", AMTA '97. 19th Meeting and Symposium, pp. 392–397 (1997).

"On-line control in wood and paper industries by means of rapid microwave linear sensors", Conference Proceedings, 22nd European Microwave Conference 92 vol. 2, pp. 1037–40 (1992) discloses a measurement using microwave sensors respectively arranged at a plurality of positions by modulated scattering techniques (MST). Moreover, "Advanced MST probe arrays for rapid diagnostic imaging", Proc 20th Annu Meet Symp Antenna Meas Tech Assoc 1998, pp. 241–246 (1998) discloses a high-speed diagnostic testing of an antenna in a near-field or a far-field by an electromagnetic wave measuring system using A-MST. In addition, "Optimization of the arrangement compact range-moduled scattering probe array for rapid far-field antenna measurement", IEE Conf Publ (Indust Electr Eng) No. 370 Pt 1 1993, pp. 376–379 (1993) discloses a measuring method for measuring a far-field pattern of an antenna by the MST which requires no mechanical movement.

"Rapid near-field antenna testing via arrays of modulated scattering probes", IEEE Trans Antennas Propag Vol. 36 No. 6 1988, pp. 804–814 (1988) discloses a measurement of a near-field of an antenna which uses an array of a number of scattering devices. Also, "Accuracy and speed characteristics of the bistatic MST for rapid near-field antenna measurements", AP-S Int Symp (IEEE Antennas Propag Soc) Vol. 1987, No. Vol. 1, pp. 174–177 (1987) discloses a method for quickly performing the near-field measurement by using a small scattering probe.

In the conventional electromagnetic wave measuring apparatus, however, a large-scaled mechanism for scanning the large measuring antenna such as the dipole antenna on the circular arc is required. Moreover, since two driving mechanisms, i.e., the scanning mechanism for scanning the measuring antenna and another mechanism for rotating the antenna to be measured are used in the measurement, the measurement takes a long period of time.

SUMMARY OF THE INVENTION

Therefore, it is an object of the present invention to provide an electromagnetic wave measuring apparatus which is capable of overcoming the above drawbacks accompanying the conventional art. The above and other objects can be achieved by combinations described in the independent claims. The dependent claims define further advantageous and exemplary combinations of the present invention.

According to the first aspect of the present invention, an electromagnetic wave measuring apparatus for measuring an electromagnetic wave radiated from an antenna to be measured, comprises: a holder operable to hold the antenna to be measured; and a plurality of probe antennas operable to detect the electromagnetic wave radiated from the antenna to be measured.

Each arc of the plurality of probe antennas may have a shielded loop probe for measuring a magnetic field in the electromagnetic wave.

The plurality of probe antennas may be arranged on a circular arc having a center substantially at the holder. Alternatively, the plurality of probe antennas may be arranged on a circle having a center substantially at the holder with constant intervals.

The electromagnetic wave measuring apparatus may further comprise: an installing unit operable to hold the plurality of probe antennas arranged on the circle; and a first rotating unit operable to rotate the installing unit around a straight line containing a diameter of the circle as a rotation axis.

The electromagnetic wave measuring apparatus may further comprise a second rotating unit operable to rotate the holder around a straight line containing a diameter of the circle as a rotation axis.

The electromagnetic wave measuring apparatus may further comprise: a measuring unit operable to measure a distribution of an electromagnetic field generated by the electromagnetic wave radiated from the antenna to be measured based on the electromagnetic wave detected by the plurality of probe antennas; and a switching unit operable to switch one of detection signals which is indicative of the electromagnetic wave detected by the plurality of probe antennas, respectively, is to be input to the measuring unit.

The electromagnetic wave measuring apparatus may further comprise: a cable group containing a plurality of cables operable to electrically connect each of the plurality of probe antennas to the measuring unit and to input each of the detection signals to the measuring unit; and an electromagnetic wave absorber, provided in surroundings of the cable group, operable to absorb the electromagnetic wave radiated from the antenna to be measured.

The plurality of probe antennas may contain vertically-polarized wave antennas each of which detects a vertically polarized component of the electromagnetic wave and horizontally-polarized wave antennas each of which detects a horizontally polarized component of the electromagnetic wave.

The vertically-polarized wave antennas and the horizontally-polarized wave antennas may be arranged to be opposed to each other with the rotation axis sandwiched therebetween.

The electromagnetic wave measuring apparatus may further comprise a fixed antenna, provided on a position away from the antenna to be measured by a predetermined distance, operable to detect the electromagnetic wave radiated from the antenna to be measured.

The measuring unit may further measure a phase difference between an electromagnetic wave detected by a first plurality of probe antennas and the electromagnetic wave detected by the fixed antenna. Moreover, the measuring unit may further measure a phase difference between an electromagnetic wave detected by a second plurality of probe antennas and the electromagnetic wave detected by the fixed antenna to further measure a phase difference between the electromagnetic waves detected by the first and second probe antennas.

The electromagnetic wave measuring apparatus may further comprise a first rotating unit operable to rotate the plurality of probe antennas around the holder as a center of rotation.

The installing unit may include a converting unit operable to convert each of the detection signals into a converted signal having a frequency different from the electromagnetic wave and to supply the converted signal to the measuring unit. In addition, the installing unit may include an electricity accumulating unit operable to supply electricity to the converting unit.

The installing unit may include: a plurality of converting units provided for the plurality of probe antennas, respectively; and a plurality of electricity accumulating units provided for the plurality of converting units, respectively, each of the electricity accumulating units supplying the electricity to a corresponding plurality of converting units.

The converting unit may output an optical signal as the converted signal and supplies the optical signal to the measuring unit via an optical fiber.

The converting unit may supply the converted signal to the measuring unit by wireless communication.

The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

DETAILED DESCRIPTION OF THE INVENTION

The invention will now be described based on the preferred embodiments, which do not intend to limit the scope of the present invention, but exemplify the invention. All of the features and the combinations thereof described in the embodiments are not necessarily essential to the invention.

Figure 1:
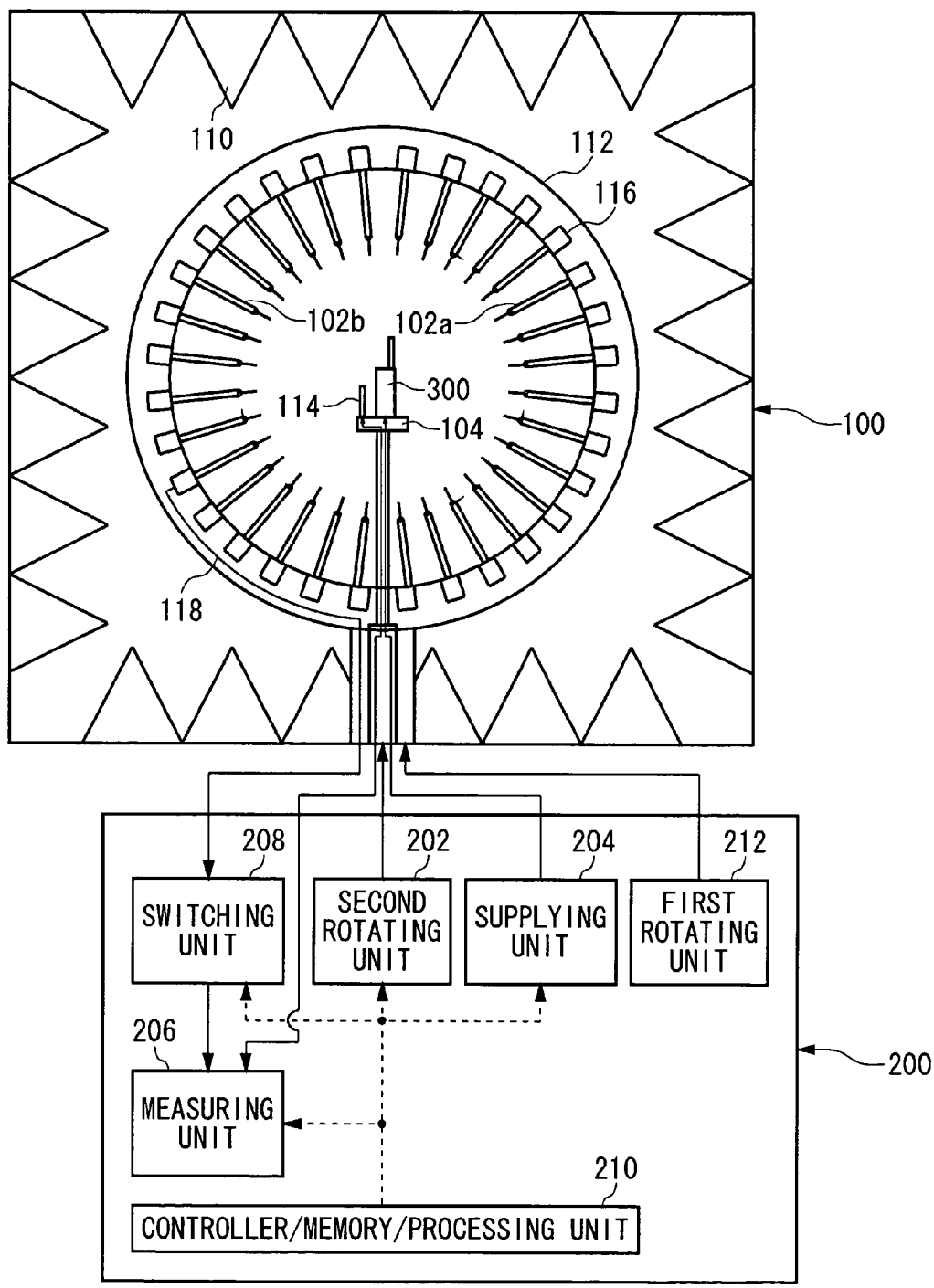
FIG. 1 illustrates a structure of an electromagnetic wave measuring apparatus according to the first embodiment of the present invention.

1st Embodiment:

FIG. 1 illustrates a structure of an electromagnetic wave measuring apparatus 10 according to the first embodiment of the present invention. The electromagnetic wave measuring apparatus 10 includes a mechanism 100 having a holder 104, a plurality of probe antennas 102, an installing unit 112, an electromagnetic wave absorber 110, a fixed antenna 114 and an optical fiber 118; and a processing system 200 having a supplying unit 204, a measuring unit 206, a switching unit 208, a controller/memory/processing unit 210, a first rotating unit 212 and a second rotating unit 202.

In the present embodiment, an antenna to be measured 300 radiates an electromagnetic wave based on an RF output signal supplied thereto. The holder 104 holds the measured antenna 300. Each probe antenna 102 detects the electromagnetic wave radiated from the measured antenna 300. The installing unit 112 holds the probe antennas 102 on a circle having a center substantially at the holder 104 (hereinafter, simply referred to as an installation ring) with constant intervals. Alternatively, the installing unit 112 may hold the probe antennas 102 on a circular arc the center of which is positioned substantially at the holder 104. The electromagnetic wave absorber 110 is provided to cover the probe antennas 102, thereby absorbing the electromagnetic wave radiated from the measured antenna 300. The fixed antenna 114 is arranged on a position away from the measured antenna 300 by a predetermined distance so that the fixed antenna 114 can detect the electromagnetic wave radiated from the measured antenna 300. The optical fiber 118 transmits detection signals that indicate the electromagnetic wave detected by the respective probe antennas 102.

The supplying unit 204 supplies the RF output signal to the measured antenna 300. The measuring unit 206 measures the electromagnetic wave radiated from the measured antenna 300 based on the detection signals respectively indicating the electromagnetic wave detected by the probe antennas 102, so as to obtain a distribution of the electromagnetic wave on the circle on which the probe antennas 102 are provided. The switching unit 208 switches one of the detection signals which is indicative of an electromagnetic field detected by the probe antennas 102 is input to the measuring unit 206 in sequence, thereby allowing the detection signals to be input to the measuring unit 206.

The controller/memory/processing unit 210 controls the respective components of the apparatus 10. Moreover, the controller/memory/processing unit 210 stores the electromagnetic field distribution measured by the measuring unit 206 so as to correspond to the amount of rotation of the holder 104.

The first rotating unit 212 rotates the installing unit 112. More specifically, the first rotating unit 212 rotates the installing unit 112 around a straight line containing a diameter of the installation ring as a rotation axis. In the present embodiment, the first rotating unit 212 rotates the installing unit 112 around a straight line vertically passing through the center of the installation ring as the rotation axis. Moreover, the first rotating unit 212 rotates the installing unit 112 by a predetermined angle in each rotation. The predetermined angle is, for example, one degree or 10 degrees. Alternatively, the first rotating unit 212 may rotate the installing unit 112 around a straight line passing in the vicinity of the diameter of the installation ring as the rotation axis. The second rotating unit 202 rotates the holder 104.

The electromagnetic wave measuring apparatus 10 of the present embodiment measures the distribution of the electromagnetic field generated by the electromagnetic wave radiated from the measured antenna 300 while repeatedly rotating the installing unit 112 that holds the probe antennas 102 by the predetermined angle in each rotation, thereby measuring the distribution of the electromagnetic field generated by the electromagnetic wave radiated from the measured antenna 300 on a sphere having a center substantially at the holder 104.

More specifically, after each rotation in which the first rotating unit 112 rotates the installing unit 112 by the predetermined angle, the measuring unit 206 measures the electromagnetic field distribution on the installation ring, formed by the electromagnetic wave radiated from the measured antenna 300, based on the detection signals indicative of the electromagnetic wave detected by the respective probe antennas 102. The electromagnetic field distribution thus measured is then stored in the controller/memory/processing unit 210 so as to correspond to the rotational amount of the installing unit 112. While the first rotating unit 212 repeatedly rotates the installing unit 112 so that the installing unit 112 is rotated by one revolution, the controller/memory/processing unit 210 measures the electromagnetic field distribution on the sphere which is scanned by the probe antennas 102 during the one-revolution of the rotation of the installing unit 102, based on the electromagnetic field distributions measured by the measuring unit 206 in the respective rotations by the predetermined rotation angle.

In the following, the probe antenna 102 and the installing unit 112 are described in more detail. The plurality of probe antennas 102 are, for example, loop antennas. Among the probe antennas 102, a probe antenna 102a detects a vertically polarized wave of the electromagnetic wave radiated from the measured antenna 300, while a probe antenna 102b detects a horizontally polarized wave thereof. The probe antenna 102a for the vertically polarized wave and the probe antenna 102b for the horizontally polarized wave are arranged to be opposed to each other with the rotation axis of the installing unit 112 sandwiched therebetween. The probe antennas 102 are preferably arranged in such a manner that the antennas for the vertical polarized wave and the antennas for the horizontally polarized wave are alternately arranged.

In the present embodiment, each of the probe antennas 102 has a shielded loop probe which measures a magnetic field in the electromagnetic wave by detecting magnetic flux perpendicular to a plane of the loop. The shielded loop probe may be a single-gap shielded loop, for example. Since the shielded loop antenna works as a magnetic sensor, the shielded loop antenna can detect the magnetic field without being affected by the electric field even in a case that the distance between the measuring antenna and the probe is short. Also, since the aperture is small, the shielded loop antenna can detect the position of the magnetic field accurately. In other words, high precision of the solid angle corresponding to the measuring antenna can be achieved even in a case that the distance between the measuring antenna and the probe is short. Thus, by comprising the shielded loop antenna, the apparatus can be miniaturized.

In the present embodiment, the probe antenna 102a for the vertical polarized wave has a shielded loop probe with a loop plane arranged on the same plane as the installation ring. On the other hand, the probe antenna 102b for the horizontally polarized wave has a shielded loop probe with a loop plane perpendicular to a plane containing the installation ring. In an alternative embodiment, the probe antennas may be minute dipole antennas, for example.

According to the electromagnetic wave measuring apparatus 10 of the present embodiment, the probe antennas 102 provided on the installation ring detect the electromagnetic wave radiated from the antenna to be measured 300. Thus, the mechanism for scanning the probe antennas 102 and the measured antenna 300 can be configured simply and it is therefore possible to simply detect the electromagnetic wave radiated from the measured antenna 300.

Moreover, according to the electromagnetic wave measuring apparatus 10, the antennas for the vertical polarized wave and the antennas for the horizontally polarized wave are arranged on the installation ring in such a manner that the antennas for the vertical polarized wave are opposed to the antennas for the horizontally polarized wave with the axis of the rotation of the installing unit 112 sandwiched therebetween. Thus, only by rotating the installing unit 112 on which the probe antennas 102 are provided by one revolution by means of the first rotating unit 212, the vertical and horizontal polarized components of the electromagnetic wave radiated from the measured antenna 300 can be detected on the sphere having the center positioned at the holder 104.

The installing unit 112 holds a plurality of probe antennas 102 provided on the installation ring with constant intervals. The installing unit 112 has a converting unit 116 that converts the detection signals indicative of the electromagnetic wave detected by the respective probe antennas 102 into converted signals having frequencies different from that of the electromagnetic wave, and supplies the converted signals to the measuring unit 206. In the present embodiment, the converting unit 116 receives as the detection signal an output voltage of the shielded loop probe included in the probe antenna 102, and then outputs as the converted signal an optical signal having the intensity in proportion to the intensity of the associated detection signal.

In the present embodiment, the installing unit 112 includes a plurality of converting units 116 that correspond to the probe antennas 102, respectively. Each converting unit 116 supplies the converted signal to the measuring unit 206 via the switching unit 208. The installing unit 112 further includes an electricity accumulating unit for supplying electricity to the converting unit 116, preferably. The installing unit 112 may include a plurality of electricity accumulating units. In the present embodiment, the installing unit 112 includes a plurality of electricity accumulating units respectively provided for the converting units 116, each of which supplies the electricity to the corresponding converting unit 116.

Figure 2:
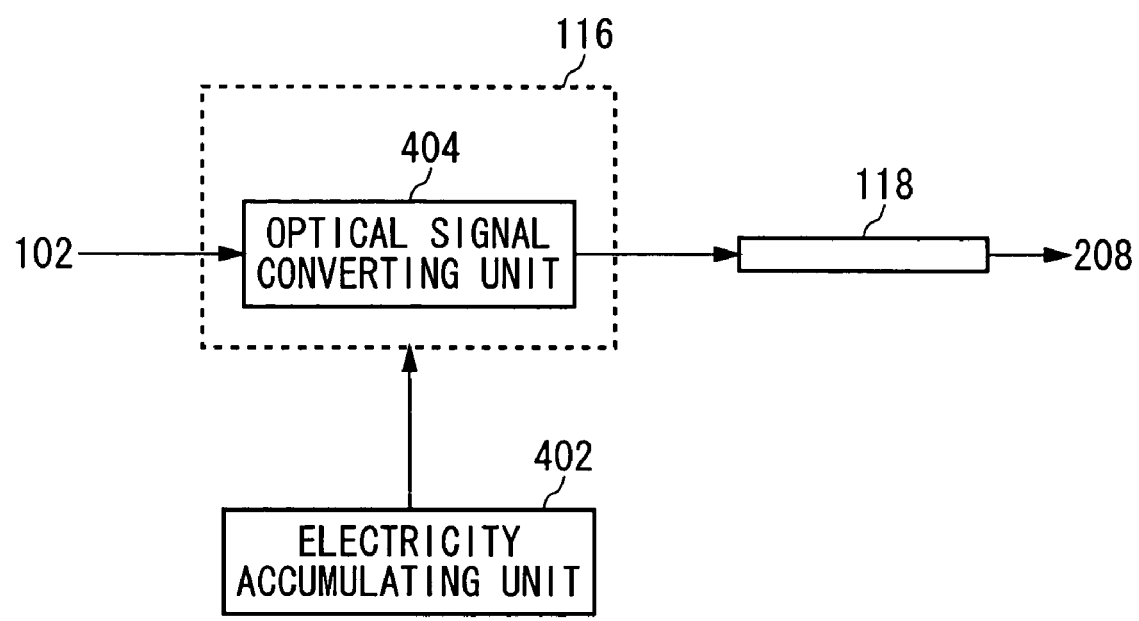
FIG. 2 shows an example of a converting unit, an electricity accumulating unit and an optical fiber according to the first embodiment of the present invention.

FIG. 2 shows an example of the converting unit 116, the electricity accumulating unit 402 and the optical fiber 118 in the present embodiment. In the present embodiment, the converting unit 116 outputs the optical signal as the converted signal so as to supply it to the switching unit 208 via the optical fiber 118. Moreover, the converting unit 116 supplies the converted signal to the measuring unit 206 (see FIG. 1) via the optical fiber 118 and the switching unit 208. In the present embodiment, the converting unit 116 has an optical signal converting unit 404 which receives the detection signal from the corresponding probe antenna 102 and converts it to the optical signal having the frequency different from that of the electromagnetic wave detected by the corresponding probe antenna 102. The optical signal converting unit 404 outputs the optical signal having the intensity in proportion to the intensity of the detected signal received from the corresponding probe antenna 102. Moreover, the optical signal converting unit 404 receives the electricity supplied from the electricity accumulating unit 402.

According to the present embodiment, by rotating the installing unit 112 by one revolution around the rotation axis while the position of the antenna to be measured 300 is kept unchanged, the distribution of the electromagnetic field generated by the electromagnetic wave radiated from the measured antenna 300 can be measured on the sphere having the center substantially at the holder 104. In addition, in a case where the present embodiment is applied to a spherical scanning electric wave holography algorism, for example, adverse effects of background noise caused by the surroundings of the probe antenna 102 can be cancelled in the process of integration for the closed space. Thus, high precision estimation of the electromagnetic field distribution can be achieved.

Moreover, in the present embodiment, the optical fiber 118 transmits the detection signals detected by the respective probe antennas 102 included in the mechanical system 100 to the processing system 200. Thus, according to the present embodiment, it is possible to reduce adverse effects of a cable or cables transmitting the signal between the mechanism 100 and the processing system 200 on the measurement result.

In another embodiment, the second rotating unit 202 may rotate the holder 104. In this case, the electromagnetic wave measuring apparatus 10 can quickly measure the electromagnetic wave by spherical scanning electric wave holography at respective positions while changing the positional relationship between the measured antenna 300 and the surroundings.

In still another embodiment, the antenna to be measured 300 may include a transmitter and radiate the electromagnetic wave based on an RF output signal generated by the transmitter. Also in this case, a phase difference between the electromagnetic wave detected by each probe antenna 102 and that detected by the other probe antenna 102 is measured based on a phase difference between the electromagnetic wave detected by each of the probe antennas 102 and that detected by the fixed antenna 114. Thus, high-precision measurement can be achieved.

Figure 3:
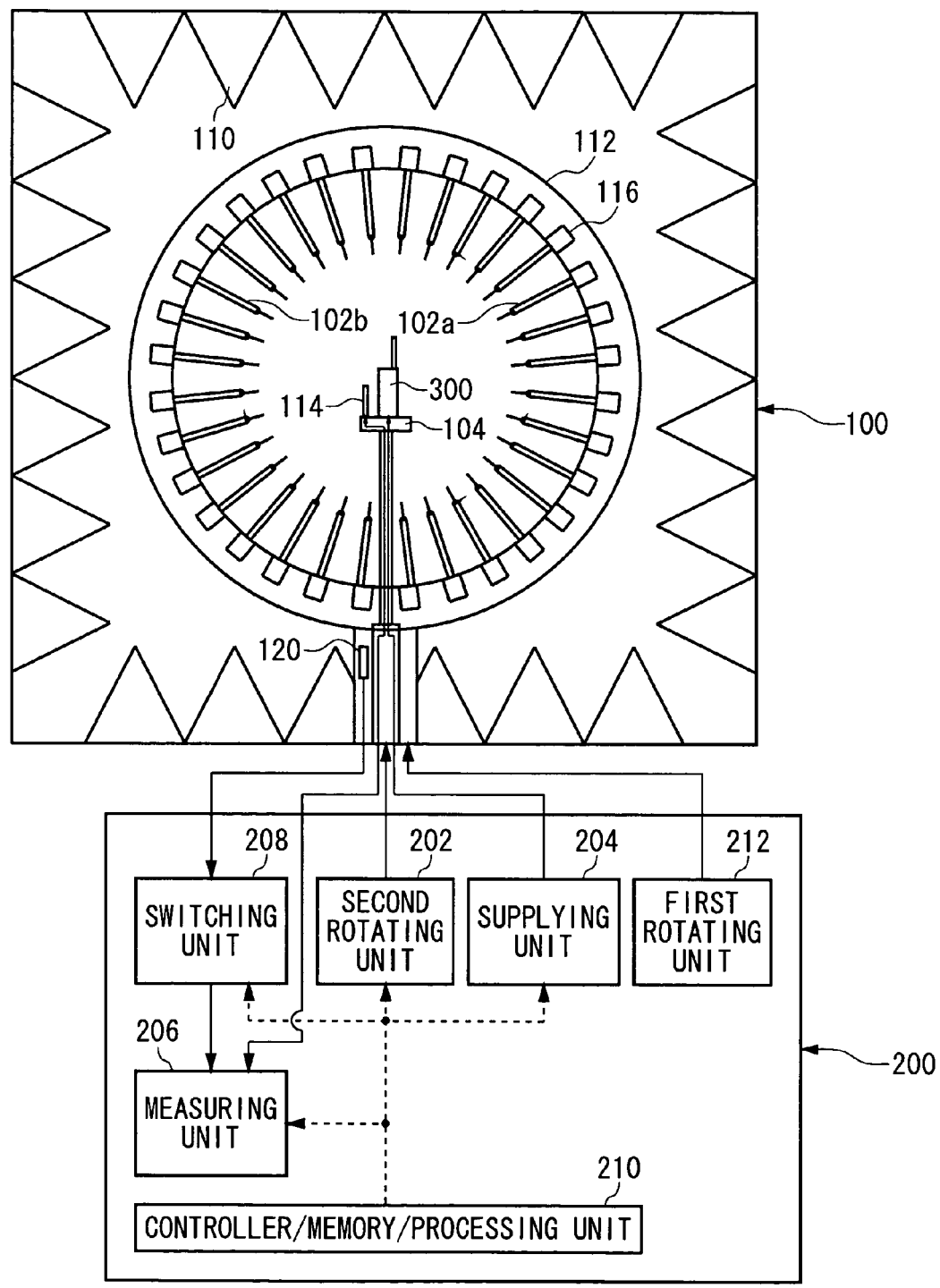
FIG. 3 illustrates a structure of an electromagnetic wave measuring apparatus according to the second embodiment of the present invention.

2nd Embodiment:

FIG. 3 illustrates a structure of an electromagnetic wave measuring apparatus 10 according to the second embodiment of the present invention. The electromagnetic wave measuring apparatus 10 includes: a mechanism 100 having a holder 104, a plurality of probe antennas 102, an installing unit 112, an electromagnetic wave absorber 110, a fixed antenna 114 and a receiving antenna 120; and a processing system 200 having a supplying unit 204, a measuring unit 206, a switching unit 208, a controller/memory/processing unit 210, a first rotating unit 212 and a second rotating unit 202. The holder 104, the probe antennas 102, the electromagnetic wave absorber 110, the fixed antenna 114, the first and second rotating units 212 and 202, the supplying unit 204, the measuring unit 206, the switching unit 208 and the controller/memory/processing unit 210 in the present embodiment have the same functions as the corresponding components in the first embodiment shown in FIG. 1.

The installing unit 112 has a plurality of converting units 116 provided for the probe antennas 102, respectively, each of which receives the detection signal indicative of the electromagnetic wave detected by the corresponding probe antenna 102 and converts it to the converted signal having the frequency different from that of the electromagnetic wave. The converted signals are supplied from the converting units 116 to the measuring unit 206. In the present embodiment, each converting unit 116 receives the output voltage of the shielded loop probe of the corresponding probe antenna 102 as the detection signal, and supplies the converted signal having the intensity in proportion to the intensity of the detection signal to the measuring unit 206 by wireless communication. The receiving antenna 120 receives the converted signals respectively sent from the converting units 116 and supplies them to the measuring unit 206 via the switching unit 208. The receiving antenna 120 is preferably provided on such a position that the receiving antenna 120 has no influence on the measurement by the electromagnetic wave measuring apparatus 10. For example, the receiving antenna 120 may be provided in the vicinity of the axis of the rotation by the first rotating unit.

Figure 4:
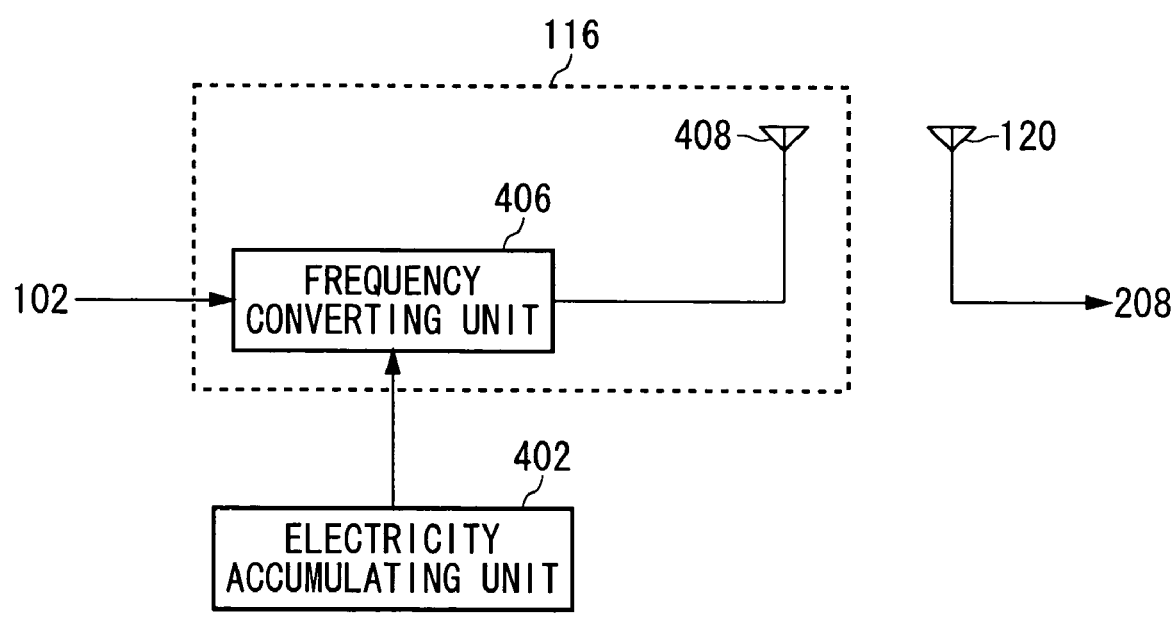
FIG. 4 shows an example of a converting unit, an electricity accumulating unit and a receiving antenna according to the second embodiment of the present invention.

FIG. 4 shows an example of the converting unit 116, the electricity accumulating unit 402 and the receiving antenna 120 in the present embodiment. In the present embodiment, each converting unit 116 includes a frequency converting unit 406 which outputs the converted signal obtained by converting the frequency of the detection signal from the corresponding probe antenna 102, and a transmitting antenna 408 which transmits the thus obtained converted signal. The transmitting antenna 408 may be a planar antenna provided on a surface of the installing unit 112, for example. The frequency converting unit 406 receives the electricity supplied from the electricity accumulating unit 402.

In the present embodiment, the transmitting antenna 408 transmits the detection signal indicative of the electromagnetic wave detected by the corresponding probe antenna 102 to the receiving antenna 120 by wireless communication. Thus, also in the present embodiment, it is possible to reduce the adverse effects of the cables(s) for transmitting signals between the mechanism 100 and the processing system 200 on the measurement result.

Figure 5:
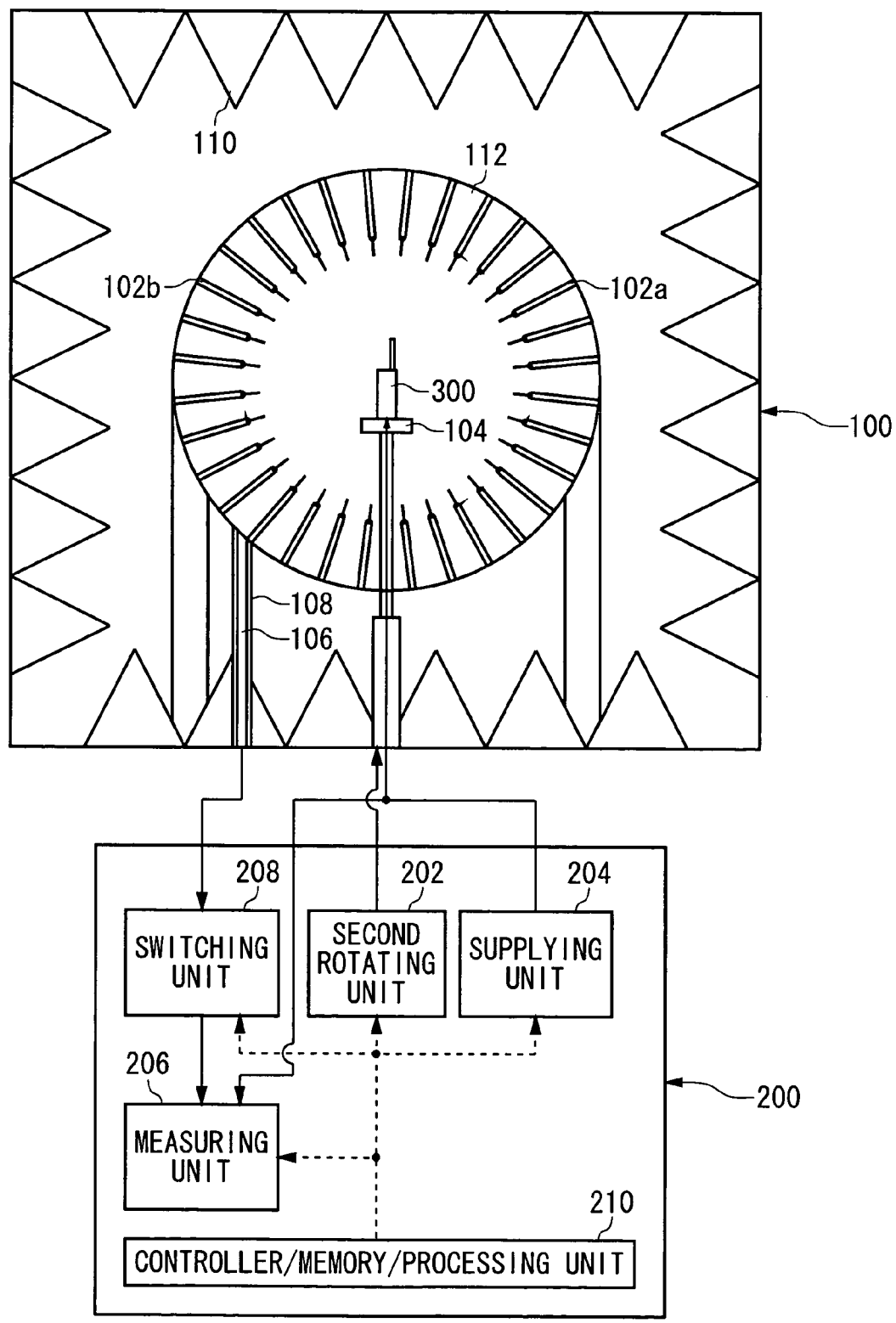
FIG. 5 illustrates a structure of an electromagnetic wave measuring apparatus according to the third embodiment of the present invention.

3rd Embodiment:

FIG. 5 illustrates a structure of an electromagnetic wave measuring apparatus 10 according to the third embodiment of the present invention. The electromagnetic wave measuring apparatus 10 includes a mechanism 100 having a holder 104 which holds an antenna to be measured 300, a plurality of probe antennas 102 each of which detects an electromagnetic wave radiated from the measured antenna 300, an installing unit 112 on which the plurality of probe antennas 102 are provided, a cable group 106 containing a plurality of cables for electrically connecting each of the probe antennas 102 and the measuring unit 206 and outputting detection signals respectively indicating the electromagnetic wave detected by the probe antennas 102 to the outside, an electromagnetic wave absorber 108 provided in surroundings of the cable group 106 for absorbing the electromagnetic wave radiated from the measured antenna 300, another electromagnetic wave absorber 110 provided to cover the probe antennas 102 for absorbing the electromagnetic wave radiated from the measured antenna 300; and a processing system 200 having a second rotating unit 202 for rotating the holder 104, a supplying unit 204 for supplying an RF output signal to the measured antenna 300, a measuring unit 206 for measuring a distribution of an electromagnetic field generated by the electromagnetic wave radiated from the measured antenna 300 based on the electromagnetic wave detected by the respective probe antennas 102, a switching unit 208 for switching one of the detection signals respectively indicating the electromagnetic wave detected by the probe antennas 102 is to be input to the measuring unit 206, a controller/memory/processing unit 210 for controlling the respective components of the electromagnetic wave measuring apparatus 100.

A plurality of probe antennas 102 are provided on the circle having the center substantially at the holder 104, i.e., the installation ring with constant intervals. The second rotating unit 202 rotates the measured antenna 300 by rotating the holder 104 around the diameter of the installation ring as the rotation axis. In other words, the second rotating unit 202 rotates the measured antenna 300 by rotating the holder 104 in a plane substantially perpendicular to a plane containing the circle. It is preferable to arrange the holder 104 substantially at the center of the installation ring. In an alternative embodiment, the probe antennas 102 may be provided on a circular arc having the center substantially at the holder 104. Moreover, the second rotating unit 202 may rotate the probe antennas 102 by rotating the installing unit 112 around the holder 104 as the center of the rotation. According to the electromagnetic wave measuring apparatus 10 of the present embodiment, the electromagnetic wave radiated from the measured antenna 300 is detected by using the probe antennas 102 provided on the installation ring. Thus, the mechanism for scanning the probe antennas 102 and the measured antenna 300 can be made simple, and it is therefore possible to simply detect the electromagnetic wave radiated from the measured antenna 300.

The probe antennas 102 are loop antennas, for example. Moreover, the probe antennas 102 contains the probe antennas 102a for detecting the vertically polarized component of the electromagnetic wave radiated from the measured antenna 300 and the probe antennas 102b for detecting the horizontally polarized component thereof. The probe antennas 102a and 102b are arranged to be opposed to each other with the axis of the rotation of the holder 104 by the second rotating unit 202 sandwiched therebetween. The probe antennas 102 are preferably arranged in such a manner that the antennas 102a for the vertically polarized wave and the antennas 102b for the horizontally polarized wave are alternately arranged.

According to the electromagnetic wave measuring apparatus 10 of the present embodiment, the antenna for the horizontally polarized wave and the antenna for the vertically polarized wave are arranged to be opposed to each other with the axis of the rotation of the holder 104 by the second rotating unit 202 sandwiched therebetween. Thus, it is possible to detect the vertically and horizontally polarized components of the electromagnetic wave radiated from the antenna to be measured 300 on a sphere having the center of which is positioned at the holder 104 only by rotating the measured antenna 300 by one revolution by means of the second rotating unit 202.

An operation of the electromagnetic wave measuring apparatus 10 of the present embodiment is described in the following. First, the supplying unit 204 supplies the RF output signal to the antenna to be measured 300. The measured antenna 300 radiates the electromagnetic wave based on the RF output signal thus supplied. The probe antennas 102 then detect the electromagnetic wave radiated from the measured antenna 300. Then, the switching unit 208 switches one of the detection signals each indicating the electromagnetic wave detected by the respective probe antenna 102 in sequence, thereby inputting these detection signals to the measuring unit 206. The measuring unit 206 then measures the electromagnetic wave radiated from the measured antenna 300 based on the detection signals input thereto, so as to obtain the electromagnetic field distribution on the circle on which the probe antennas 102 are arranged. The controller/memory/processing unit 210 stores the electromagnetic field distribution thus measured by the measuring unit 206 so as to correspond to the rotation amount of the holder 104.

Then, the second rotating unit 202 rotates the holder 104 which holds the measured antenna 300 by a predetermined angle. The predetermined angle is, for example, one degree or ten degrees. Each of the probe antennas 102 detects the electromagnetic wave radiated from the measured antenna 300. The switching unit 208 switches one of the detection signals indicating the electromagnetic wave detected by the respective probe antennas 102 is to be input to the measuring unit 206 in sequence, thereby inputting these detection signals to the measuring unit 206 in a sequential manner. The measuring unit 206 then measures the electromagnetic field distribution generated by the electromagnetic wave radiated from the measured antenna 300 based on the detection signals input thereto. The controller/memory/processing unit 210 stores the measured electromagnetic field distribution so as to correspond to the rotation amount of the holder 104.

In the above-mentioned manner, the electromagnetic field distribution generated by the electromagnetic wave radiated from the measured antenna 300 is measured, while the holder 104 which holds the measured antenna 300 is rotated by the predetermined angle repeatedly, thereby the electromagnetic field distribution on the sphere having the center substantially at the holder 104, that is generated by the electromagnetic wave radiated from the measured antenna 300, can be measured.

Figure 6:
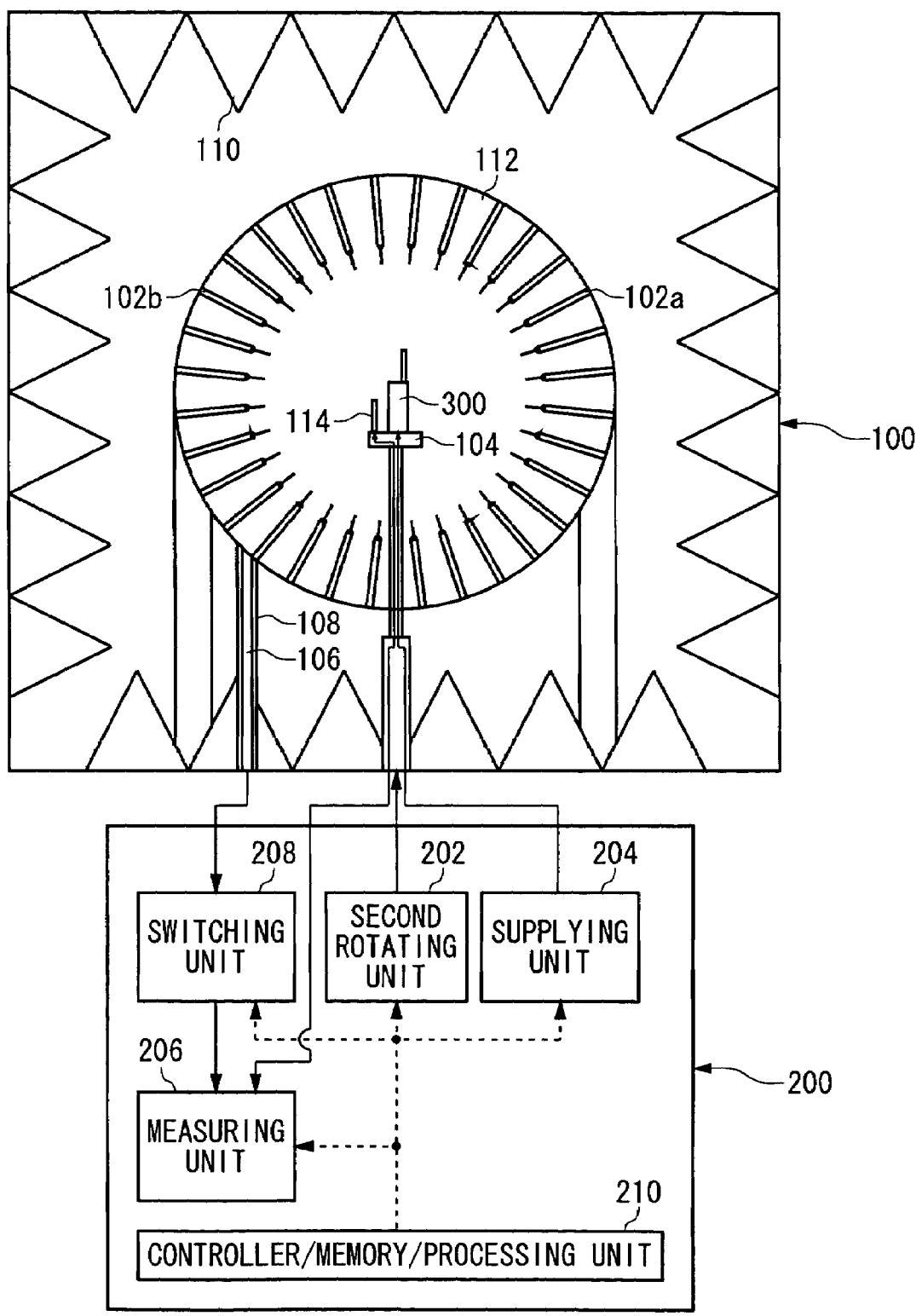
FIG. 6 illustrates a structure of an electromagnetic wave measuring apparatus according to the fourth embodiment of the present invention.

4th Embodiment:

FIG. 6 illustrates an electromagnetic wave measuring apparatus 10 according to the fourth embodiment of the present invention. The electromagnetic wave measuring apparatus 10 further includes a fixed antenna 114 for detecting the electromagnetic wave radiated from the measured antenna 300, which is arranged on a position away from the measured antenna 300 by a predetermined distance, in addition to the components of the apparatus shown in FIG. 5. The fixed antenna 114 is held by the holder 104 and remains unchanged relative to the measured antenna 300 irrespective of the rotation of the holder 104. The fixed antenna 114 detects the electromagnetic wave radiated from the measured antenna 300 and outputs a reference signal indicative of the detected electromagnetic wave to the measuring unit 206.

In the present embodiment, the measuring unit 206 measures a phase difference between the electromagnetic wave detected by each of the probe antennas 102 and that detected by the fixed antenna 114. Moreover, based on the thus measured phase difference between the electromagnetic wave detected by each of the probe antennas 102 and that detected by the fixed antenna 114, the measuring unit 206 measures a phase difference between the electromagnetic wave detected by each probe antenna 102 and that detected by the other probe antenna 102.

Furthermore, by measuring the phase differences of the electromagnetic wave between the positions of the probe antennas 102 while the measured antenna 300 is repeatedly rotated in such a manner the measured antenna 300 is rotated by a predetermined rotation angle in each rotation, the phase differences of the electromagnetic wave between respective positions on the sphere can be measured.

According to the present embodiment, the phase differences between the electromagnetic waves detected by the respective probe antennas 102 are measured based on the phase difference between the electromagnetic wave detected by each of the probe antennas 102 and that detected by the fixed antenna 114. Thus, high precision measurement can be achieved.

In addition, the electromagnetic wave measuring apparatus 10 uses a probe antenna having a shielded loop probe as the antenna for detecting the electromagnetic wave radiated from the measured antenna 300. Thus, it can be fabricated with a very small size. Moreover, since the electromagnetic wave radiated from the measured antenna 300 is detected by the probe antennas provided on the circle having the center substantially at the measured antenna 300, the measurement can be performed without the actual scan of the probe antennas.

Although the present invention has been disclosed by way of the exemplary embodiments, it should be understood that those skilled in the art might make many changes and substitutions without departing from the spirit and the scope of the present invention which is defined only by the appended claims.

As is apparent from the above, according to the present invention, a small-sized electromagnetic wave measuring apparatus that enables simple measurement of the electromagnetic wave radiated from the antenna to be measured can be provided.

What is claimed is:

1. An electromagnetic wave measuring apparatus for measuring an electromagnetic wave radiated from an antenna to be measured comprising:
    a holder operable to hold said antenna to be measured;
    a plurality of probe antennas operable to detect said electromagnetic wave radiated from said antenna to be measured;
    an installing unit operable to hold said plurality of probe antennas arranged on said circle; and
    a first rotating unit operable to rotate said installing unit around a straight line containing a diameter of said circle as a rotation axis,
    wherein said plurality of probe antennas are arranged on a circle having a center substantially at said holder with constant intervals.

2. An electromagnetic Wave measuring apparatus for measuring an electromagnetic wave radiated from an antenna to be measured comprising:
    a holder operable to hold said antenna to be measured;
    a plurality of probe antennas operable to detect said electromagnetic wave radiated from said antenna to be measured; and
    a second rotating unit operable to rotate said holder around a straight line containing a diameter of said circle as a rotation axis,
    wherein said plurality of probe antennas are arranged on a circle having a center substantially at said holder with constant intervals.

3. An electromagnetic wave measuring apparatus as claimed in claim 1, further comprising:
    a measuring unit operable to measure a distribution of an electromagnetic field generated by said electromagnetic wave radiated from said antenna to be measured based on said electromagnetic wave detected by said plurality of probe antennas; and
    a switching unit operable to switch which one of detection signals indicative of said electromagnetic wave detected by said plurality of probe antennas, respectively, is to be input to said measuring unit.

4. An electromagnetic wave measuring apparatus as claimed in claim 3, further comprising:
    a cable group containing a plurality of cables operable to electrically connect each of said plurality of probe antennas to said measuring unit and to input each of said detection signals to said measuring unit; and
    an electromagnetic wave absorber, provided in surroundings of said cable group, operable to absorb said electromagnetic wave radiated from said antenna to be measured.

5. An electromagnetic wave measuring apparatus as claimed in claim 3, wherein said plurality of probe antennas contains vertically-polarized wave antennas each of which detects a vertically polarized component of said electromagnetic wave and horizontally-polarized wave antennas each of which detects a horizontally-polarized component of said electromagnetic wave.

6. An electromagnetic wave measuring apparatus as claimed in claim 5, wherein said vertically-polarized wave antennas and said horizontally-polarized wave antennas are arranged to be opposed to each other with said rotation axis sandwiched therebetween.

7. An electromagnetic wave measuring apparatus as claimed in claim 3, further comprising a fixed antenna, provided on a position away from said antenna to be measured by a predetermined distance, operable to detect said electromagnetic wave radiated from said antenna to be measured.

8. An electromagnetic wave measuring apparatus as claimed in claim 7, wherein said measuring unit further measures a phase difference between an electromagnetic wave detected by a first one of said plurality of probe antennas and said electromagnetic wave detected by said fixed antenna.

9. An electromagnetic wave measuring apparatus as claimed in claim 8, wherein said measuring unit further measures a phase difference between an electromagnetic wave detected by a second said plurality of probe antennas and said electromagnetic wave detected by said fixed antenna to further measure a phase difference between said electromagnetic waves detected by said first and second probe antennas.

10. An electromagnetic wave measuring apparatus for measuring an electromagnetic wave radiated from an antenna to be measured, comprising:
    a holder operable to hold said antenna to be measured;
    a plurality of probe antennas operable to detect said electromagnetic wave radiated from said antenna to be measured; and
    a first rotating unit operable to rotate said plurality of probe antennas around said holder as a center of rotation,
    wherein said plurality of probe antennas are arranged on a circle having a center substantially at said holder with constant intervals.

11. An electromagnetic wave measuring apparatus as claimed in claim 3, wherein said installing unit includes a converting unit operable to convert each of said detection signals into a converted signal having a frequency different from said electromagnetic wave and to supply said converted signal to said measuring unit.

12. An electromagnetic wave measuring apparatus as claimed in claim 11, wherein said installing unit includes an electricity accumulating unit operable to supply electricity to said converting unit.

13. An electromagnetic wave measuring apparatus as claimed in claim 12, wherein said installing unit includes:
   a plurality of converting units provided for said plurality of probe antennas, respectively; and
   a plurality of electricity accumulating units provided for said plurality of converting units, respectively, each of said electricity accumulating units supplying said electricity to a corresponding one of said plurality of converting units.

14. An electromagnetic wave measuring apparatus as claimed in claim 11, wherein said converting unit outputs an optical signal as said converted signal and supplies said optical signal to said measuring unit via an optical fiber.

15. An electromagnetic wave measuring apparatus as claimed in claim 11, wherein said converting unit supplies said converted signal to said measuring unit by wireless communication.

16. An electromagnetic wave measuring apparatus as claimed in claim 2, further comprising:
   a measuring unit operable to measure a distribution of an electromagnetic field generated by said electromagnetic wave radiated from said antenna to be measured based on said electromagnetic wave detected by said plurality of probe antennas; and
   a switching unit operable to switch which one of detection signals indicative of said electromagnetic wave detected by said plurality of probe antennas, respectively, is to be input to said measuring unit.

* * * * *